(12) United States Patent
Scott

(10) Patent No.: US 6,470,477 B1
(45) Date of Patent: Oct. 22, 2002

(54) METHODS FOR CONVERTING FEATURES TO A UNIFORM MICRON TECHNOLOGY IN AN INTEGRATED CIRCUIT DESIGN AND APPARATUS FOR DOING THE SAME

(75) Inventor: Gregory Stuart Scott, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/470,779

(22) Filed: Dec. 23, 1999

(51) Int. Cl.$^7$ .............................................. G06F 17/50

(52) U.S. Cl. ..................... 716/3; 716/5; 716/9; 716/10; 716/13

(58) Field of Search .............................. 716/3, 5, 9, 10, 716/13

(56) References Cited

U.S. PATENT DOCUMENTS

| | | | |
|---|---|---|---|
| 5,440,720 A | 8/1995 | Baisuck et al. ................ | 703/2 |
| 5,497,334 A | 3/1996 | Russell et al. ................. | 716/5 |
| 5,515,293 A | 5/1996 | Edwards ...................... | 716/11 |
| 5,559,718 A | 9/1996 | Baisuck et al. ................ | 716/5 |
| 5,987,240 A | 11/1999 | Kay ............................... | 716/5 |
| 6,011,911 A | * 1/2000 | Ho ................................. | 716/5 |
| 6,155,725 A | * 12/2000 | Scepanovic .................... | 716/9 |

* cited by examiner

Primary Examiner—Matthew Smith
Assistant Examiner—Thuan Do
(74) Attorney, Agent, or Firm—Peter Zawilski (57) ABSTRACT

A method for converting physical features of an integrated circuit design to a uniform micron technology is provided. The integrated circuit design is defined by a plurality of cells with each cell being defined by one or more micron technologies. A user is prompted to provide key design rules that define desired features associated with one or more micron technologies. The method includes examining a layout database for the integrated circuit design with the layout database having a hierarchical structure. A top cell is identified from the layout database of the integrated circuit design. The method then descends through a first branch of the hierarchical structure of the layout database to a lowest cell in the first branch. Afterwards, a determination is made whether or not physical data of the user desired features have been previously processed for the lowest cell. Once that determination is made, the method decides if the physical data of the user desired features for the lowest cell complies with the uniform micron technology. If the features do not comply with the uniform technology, the physical data of the user desired features of the lowest cell is processed. A design rule check is also performed once the conversion is complete for all branches of the top cell to ensure that the processed physical data of the user selected features comply with the design rules chosen by the user. In addition, once one subcell is processed, all other instances of that subcell are also instantly considered processed. Therefore, the method will skip those subcells and only process non-processed subcells. The layout data of the IC design can now be converted into reticles for IC fabrication.

18 Claims, 5 Drawing Sheets

METHODS FOR CONVERTING FEATURES TO A UNIFORM MICRON TECHNOLOGY IN AN INTEGRATED CIRCUIT DESIGN AND APPARATUS FOR DOING THE SAME

BACKGROUND OF THE INVENTION

1. Field of the Invention

The present invention relates to semiconductor feature layout generation, and more particularly, to intelligent computer implemented methods for inspecting and modifying features of a given layout design to comply with defined constraints.

2. Description of the Related Art

Today's semiconductor devices are continually being pushed to meet stricter demands. As devices using this technology inundate the marketplace, consumers are continuing to place higher demands on these devices. These demands include smaller, more compact devices with greater functionality.

In order to meet these demands, semiconductor devices are becoming smaller and smaller. These smaller devices use tighter design tolerances with more demanding design rules in order to allow for their size. The smaller devices allow for more compact integration of circuitry on a semiconductor chip. Also, the smaller designs require less space for greater functionality within a circuit. The design tolerances used within semiconductor devices are commonly associated to a particular micron technology. Thus, each type of micron technology requires conformance with a particular set of design rules The design rules for one micron technology (e.g., 0.18 micron technology) are necessarily different than other micron technologies (e.g., 0.25 micron technology).

The design tolerances and accompanying design rules are implemented at the design level using computer aided design (CAD) tools. As is well known, design engineers typically use cell libraries to construct a desired integrated circuit device. The cell libraries are typically optimized for one micron technology or another. In some cases, it may be desired to implement cells from different libraries, such that some cells include features designed in accordance with one set of design rules and other cells use another set of design rules. When a given design initially has cells with different design rules, fabrication problems can arise. For process compatibility, it is well known that all cells of a given design have the same design rules. To comply with this requirement, design engineers use software tools to inspect and change the physical sizes of features in certain cells to ensure that all cells are of the same micron technology. For instance, one of the many cells is a 0.25 micron technology cell and all others are 0.18 micron technology cells, the features of the 0.25 micron technology cells will be modified (e.g., resized) to convert them into 0.18 micron technology features. This conversion is generally performed directly on flat data. Flat data is referred to herein as data representing the geometric features on the different levels of an integrated circuit device. For example, some devices may include several dozen mask layouts, each representing a plurality of geometric features (e.g., interconnect lines, contact features, via features, gate electrode features, etc.) An exemplary mask generation tool used to perform such modifications may be a software product named CATS (computer aided transcription system), which is available from Transcription Enterprises, L.T.D., of Los Gatos, Calif.

It should be noted that such software is programmed to inspect and modify each feature in the design one at a time. This is true even when the same geometric feature is repetitively used throughout a given design. For example, if a via hole feature is resized on one part of a design, that same resizing operation must be repeated for all other via holes. Although this process does not appear to be complex, integrated circuit designs have many thousands of features that repeat throughout a design. Consequently, having to inspect each feature and operate a particular resizing operation repetitively can be quite time consuming. In some cases, the process of modifying features can take up to a couple of days of computer processing time.

In accordance with the prior art, once the features have been modified, it is not possible to use standard design rule checkers (DRCs) to review whether or not the newly modified features comply with their new design rules. For example, if one or more 0.25 micron cells (each cell including a plurality of features on different levels) were modified down to a 0.18 micron technology, then a DRC checker would not be able to check whether the newly created 0.18 micron technology features meet the 0.18 micron technology design rules. This is because DRC checkers are only able to examine designs originally created in accordance with one micron technology or another. Also, when programs such as CATS are used to modify a design, the modified features may have new imperfections that cannot be examined by DRC checkers.

Because designs have thousands or millions of features, engineers typically find it impossible to manually inspect the entire design. Thus, many times engineers proceed with the fabrication of the reticles incorporating the features designs and only hope that the designs function as intended. Of course, if the design fails, a substantial waste of manufacturing time and materials will already have been expended.

In view of the foregoing, there is a need for a computer implemented method which can intelligently modify design features of different cells to conform to one set design rules.

SUMMARY OF THE INVENTION

Broadly speaking, the present invention fills these needs by providing a computer implemented method which can intelligently modify design features selected by a user to conform to one set of design rules selected by a user. It should be appreciated that the present invention can be implemented in numerous ways, including as a process, as apparatus, a system, a device, a method or a computer readable media. Several inventive embodiments of the present invention are described below.

In one embodiment, a method for converting physical features of an integrated circuit design to a uniform micron technology is disclosed. The integrated circuit design is defined by a plurality of cells with each cell being defined by one or more micron technologies. A user is prompted to provide key design rules which define desired features associated with one or more micron technologies. The method comprises examining a layout database which has a hierarchical structure for the integrated circuit design. After examining the layout database, a top cell from the layout data base of the integrated circuit design is identified. Then, the method descends through a first branch of the hierarchical structure of the layout database to a lowest cell in the first branch. Once the lowest cell is reached, a determination is made as to whether physical data of the user desired features have been previously processed for the lowest cell. Next, it is determined if the physical data of the user desired features for the lowest cell comply with the user specified uniform micron technology. The physical data of the user desired features is then processed if the lowest cell has not been previously processed and does not comply with the uniform micron technology. Once one subcell is processed, all other instances of that subcell are also instantly considered processed. Therefore, the method will skip those subcells and only process non-processed subcells. The converted and checked layout data of the IC design can then be converted into reticles for IC fabrication.

In another embodiment, a method for the efficient conversion of features in an integrated circuit design is disclosed. A user selects the features to be converted in the integrated circuit design. The user also selects the uniform micron technology to be used for the features. The method comprises providing an integrated circuit design that is defined by a hierarchical layout database of multiple cells. Then, a top cell of the hierarchical layout database and subcells nested from the top cell are identified. After the subcells are identified, the method proceeds to descend to a lowest subcell of the subcells. Once the lowest subcell is reached, a determination is made if the physical data of the features selected by the user in the lowest subcell have been previously processed. If it is determined that the physical data has not been previously processed, the method checks if the physical data of the features selected by the user in the lowest subcell conform to the uniform micron technology selected by the user. If the physical data does not conform to the uniform micron technology, the physical data of the features selected by the user in the lowest subcell is processed such that the physical data conforms to the uniform micron technology. Once there are no more non-processed subcells for a particular branch, the previous subcell itself is processed. This method therefore continues until all branches coming from the top cell have been processed.

In yet another embodiment, a computer readable media having program instructions for carrying out a method for the efficient conversion of features in an integrated circuit design is disclosed. A user selects the features to be converted in the integrated circuit design and a uniform micron technology for the features. The computer readable media comprises programming instructions for providing the integrated circuit design wherein the integrated circuit design is defined by a hierarchical layout database of multiple cells. The programming instructions identify a top cell and subcells nested from the top cell in the hierarchical layout database. The programming instructions also descend to a lowest subcell of the top cell and process physical data of the features selected by the user to conform the physical features to the uniform micron technology in the lowest subcell.

The many advantages of the present invention should be recognized. The present invention allows designers to check and convert selected features in a more efficient manner. Now, the time it takes to check and convert features in an integrated circuit design is greatly reduced due to the global change capability of the present invention. After the features in a subcell are converted, all other instances of that subcell will automatically be converted once the conversion is complete for the initial occurrence.

Another advantage of the present invention is the ability to run a design rule checker after the conversions are complete. This capability gives designers more confidence in the integrated design since any imperfections with the conversions will be found before a design is used to form a reticle. The design rule checker will check all the conversions to ensure they comply with the design rules selected by the user.

As a further advantage, the present invention allows designers the flexibility to check an integrated circuit design before a reticle is formed without wasting days checking the design. An integrated circuit design may be checked and converted in a much shorter time than the prior art, therefore designers are apt to actually check the integrated circuit design before a reticle is formed.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

A method for converting user defined features of an integrated circuit design to a uniform micron technology and checking for compliance with the design rules associated with that uniform micron technology is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
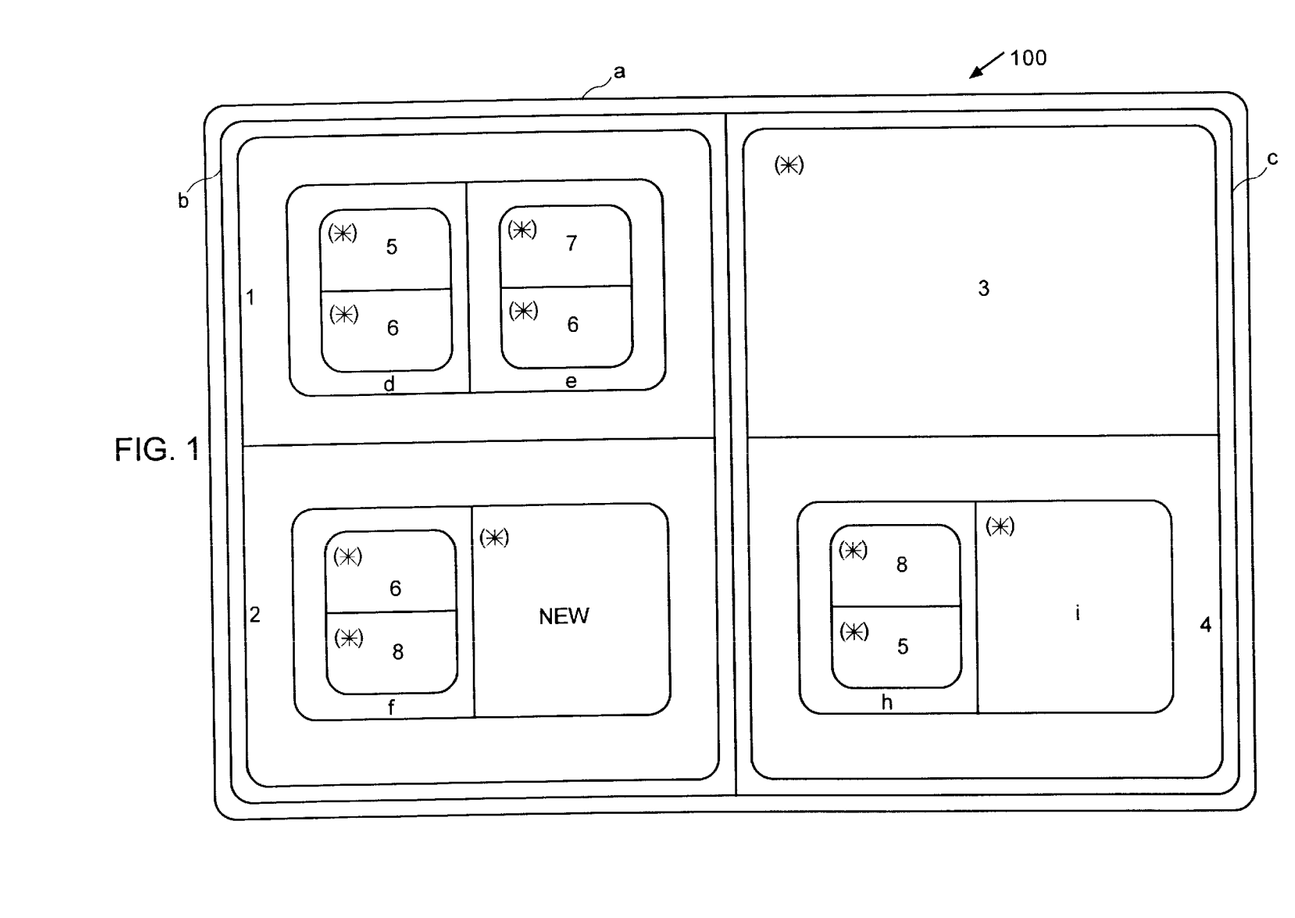
FIG. 1 is a top view of an embodiment of the present invention which shows a simplistic representation of an integrated circuit design.

In FIG. 1, a top level view of an integrated circuit design 100 is shown in accordance with one embodiment of the present invention. The integrated circuit (IC) design 100 is comprised of a top cell "a" and nested subcells "b" through "f", "h", "i" "new" and "1" through "8." The subcells denoted with asterisks are lowest subcells which define most of the features at a mask level for the integrated circuit design 100. The cells define a variety of features, for example, contacts, vias, source drain regions, dopant wells, metallization lines, etc. Although there are many features in each of the cells, some cells will actually be replicated (each replicated cell being an "instance" of a given cell) in other cells.

As is well known, the IC design having top cell "a" and subcells "b" through "f", "h", "i", "new" and "1" through "8." are designed by a user using a computer aided design program (CAD). Each of the cells are defined by various features which are pulled from different libraries. However, the various features in the libraries use different micron technologies. As used herein, the phrase "micron technology" refers to the design rule parameters used to generate various features within an IC layout design. Therefore, different cells may be defined by features using varying micron technologies. For example, a designer may select features using 0.25 micron technology for the lowest subcell "6" shown in FIG. 1 and features using 0.18 micron technology for the lowest subcell "7." The user typically designs the integrated circuit design 100 by choosing features from different libraries, each library may be defined from a variety of micron technol ogies. Thus, the subcell "e," which is defined by nested subcells "6" and "7," is comprised of subcells designed with two different types of micron technologies, namely 0.25 micron technology and 0.18 micron technology, as shown in FIG. 1. The subcells of the integrated circuit design 100 are defined by a hierarchical structure 100' as shown in FIG. 2.

Figure 2:
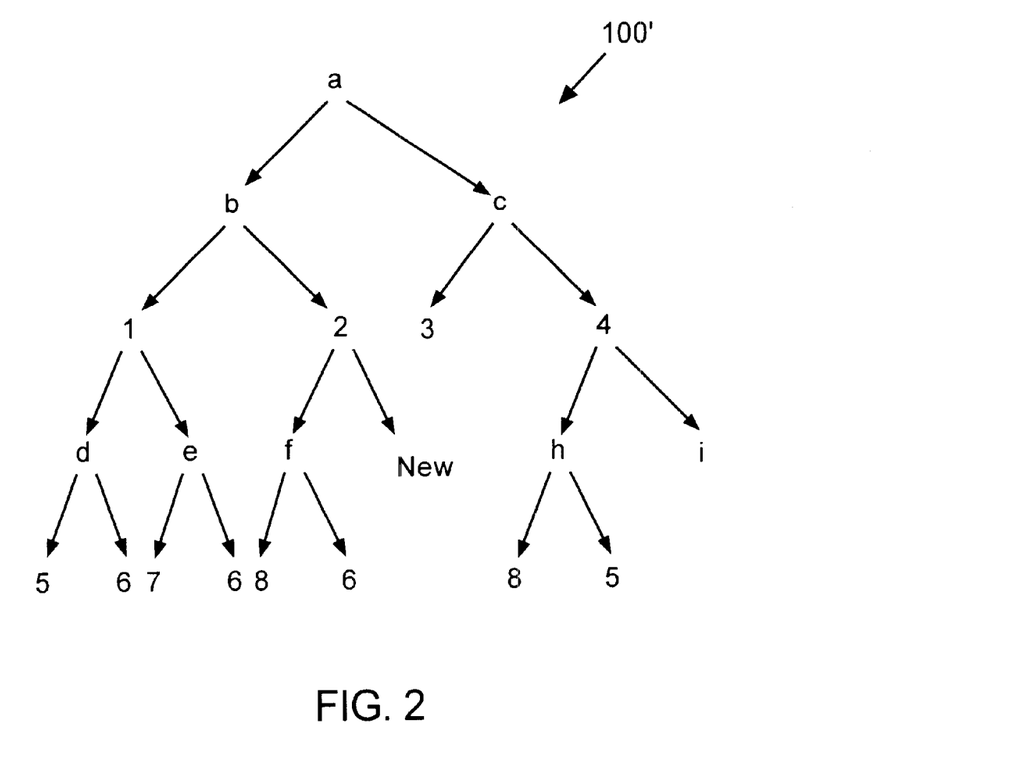
FIG. 2 depicts the hierarchical structure of the integrated circuit design in accordance with one embodiment of the present invention.

FIG. 2 depicts the hierarchical structure 100' of the integrated circuit design 100 in accordance with one embodiment of the present invention. FIG. 2 shows the interrelation of all the subcells within the integrated circuit design 100. FIG. 2 also shows the manner in which the lowest subcells define upper subcells and the formation of the top cell "a" from the subcells "b" through "f", "h", "i", "new" and "1" through "8.". The top cell "a" branches into subcells "b" and "c" which branch into lower subcells until the lowest subcell is reached. As shown in FIG. 2, the lowest subcells in this embodiment of the invention are the subcells "3," "5" through "8," "new" and "i".

Figure 3A:
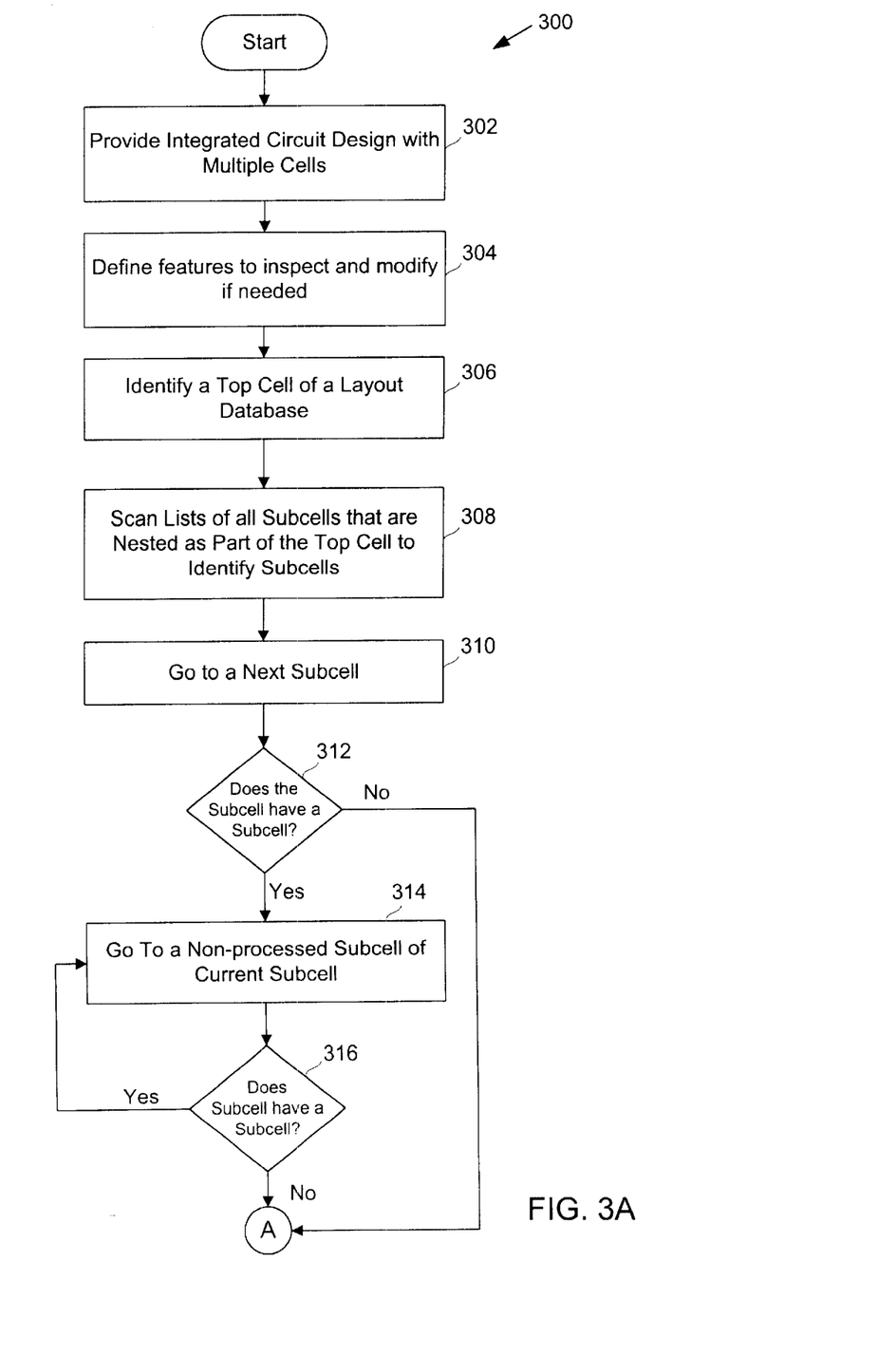
FIG. 3A is a flowchart showing a method for converting selected physical features of a integrated circuit design to a uniform micron technology in accordance with one embodiment of the present invention.

FIG. 3A is a flowchart showing a method 300 of converting selected physical features of the integrated circuit design 100 to a uniform micron technology in accordance with one embodiment of the present invention. As discussed with reference to FIG. 1, the various subcells may be defined by features of different micron technologies. The method 300 will convert user selected features of the subcells to a uniform micron technology.

According to the method 300, an integrated circuit design 100 having multiple cells is provided, as shown in operation 302. The integrated circuit design 100 is provided as a layout database that defines the hierarchical structure 100', as previously discussed with respect to FIG. 2. In operation 304, a user inputs which feature types of the subcells are to be inspected for the integrated circuit design 100 and specifies what uniform micron technology should be used. The user also inputs the design rules associated with the desired particular micron technology. Therefore, all instances of the features defined by the user will be modified to a uniform micron technology specified by the user.

After the user has input the features to be checked along with the uniform micron technology and the associated design rules, the method identifies a top cell of the layout database within the integrated circuit design in operation 306. Making reference to FIG. 2, FIG. 2 is an example of a top cell "a" with nested subcells. The top cell "a" branches off into nested subcells "b" and "c" which define the top cell. The method in operation 308 scans the list of the subcells to identify subcells contained within the top cell. In this example, the method will find all subcells associated with the top cell "a."

The method now proceeds to operation 310, where the method goes to a next subcell identified during operation 308. For purposes of example, the method will go to subcell "b" during operation 310. After the method goes to a next subcell, the method will proceed to operation 312, where it is determined whether the current subcell has a subcell (e.g., along a current branch of the hierarchical structure 100'). In this example, subcell "b" does have a subcell so the method will proceed to operation 314 where the process goes to a non-processed subcell of the current subcell. A non-processed subcell is a subcell which has not been previously processed to determine if the subcell is in compliance with the uniform technology specified by the user. In addition, a non-processed subcell is a subcell that may have been made using a micron technology different from the uniform micron technology and has not yet been converted. Therefore, a processed subcell is a subcell which has been checked for compliance with the uniform micron technology and converted to the uniform micron technology if features within the subcell were made using a different micron technology.

In our example, the non-processed subcell may be subcell "1." At this point, the method moves to operation 316 where it is determined whether the current subcell has a subcell. As shown in FIG. 2, subcell 1 does have a subcell so the method will move to operation 314 and the method proceeds to a non-processed subcell. In our example, the method will proceed to subcell "d" in FIG. 2. The method will move again to operation 316 where it will determine if subcell "d" has a subcell. As shown in FIG. 2, subcell "d" has a subcell 5, thus the method will revert back to operation 314, where it will go to a non-processed subcell "5" of subcell "d." Once it moves to subcell "5," the method will go to operation 316 and determine that subcell "5" does not have a subcell. The method will then proceed to operation 318 as shown in FIG. 3B.

Figure 3B:
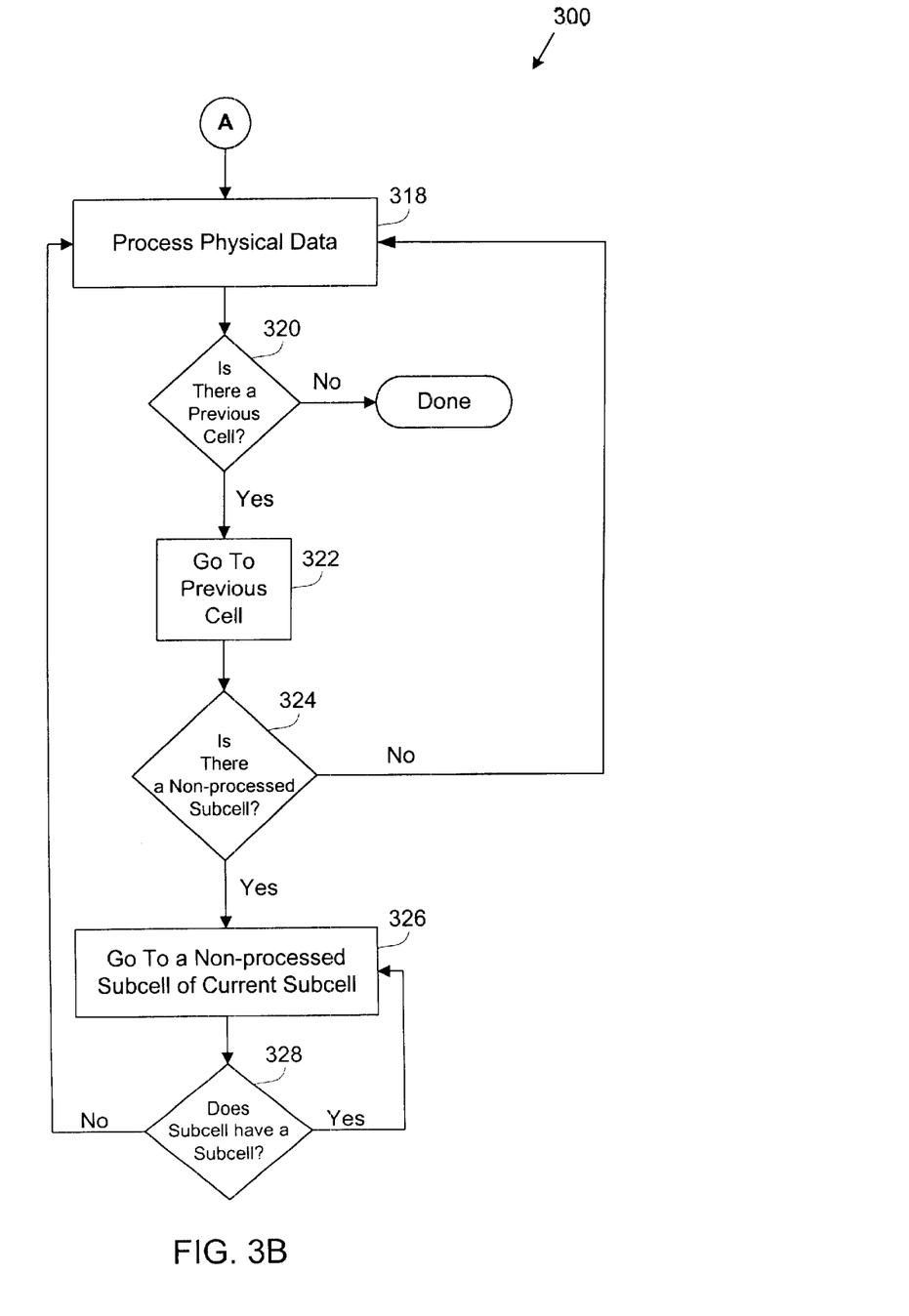
FIG. 3B is a continuation of the flowchart of FIG. 3A showing a method of converting selected physical features of the integrated circuit design to a uniform micron technology in accordance with one embodiment of the present invention.

FIG. 3B is a continuation of the flowchart of FIG. 3A, in accordance with one embodiment of the present invention. The operation 318 will process the physical data of the subcell "5," which is defined to be a lowest subcell. As will be discussed below with reference to FIG. 4, operation 318 determines if the physical data contained within a subcell complies with the uniform micron technology as specified by the user. If the method determines that the physical data does not comply with the uniform micron technology during operation 318, it will make any necessary changes to effect compliance. Once the physical data has been processed, the method will perform operation 320 to determine if there is a previous subcell. Referring back to the original example, once the method is done processing subcell "5," it will find that the subcell "5" has a previous subcell "d" in operation 320. After the method determines that there is a previous subcell, operation 322 will be performed and the method will go to the previous subcell. In our example, the method will go to subcell The method now moves to operation 324 and determines if there is a non-processed subcell of the current subcell. Referring again to FIG. 2, subcell "d" has another non-processed subcell, subcell "6." After the method determines that there is a non-processed subcell, it will move to operation 326 and go to the non-processed subcell. In this case, the method will move to subcell "6" and then advance to operation 328. In operation 328, the method will determine if the subcell has a subcell. Here, subcell "6" does not have a subcell, thus the method will revert back to operation 318 where the physical data of subcell "6" is processed. Once the physical data of subcell "6" is processed, the method will proceed to operation 320 and determine if subcell "6" has a previous subcell. Subcell "d" is previous to subcell "6" as shown in FIG. 2. As such, the method will go to subcell "d"

under operation 322. The method now determines if there is another non-processed subcell of subcell "d" in operation 324. As depicted in FIG. 2, subcell "d" does not contain another non-processed subcell in addition to subcells "5" and "6". Thus, the method will return to operation 318 where the physical data of subcell "d" is processed. Once processed, the method moves to operation 320 to determine if there is a previous subcell. As shown in FIG. 2, subcell "1" is the previous subcell of subcell "d."

The method in operation 322 moves to subcell "1," and again to operation 324 where it is determined if there is a non-processed subcell. The method will find that the branch defining subcell "e" has a subcell which has not been processed. At this point, the method advances to operation 326, which in our example would be subcell "e" in FIG. 2. From operation 326, the method goes to operation 328 to determine if the subcell has a subcell. Here, subcell "e" does have subcell "7." The method will go to subcell "7" in operation 326 and determine if subcell "7" has a subcell in operation 328. As can be seen in FIG. 2, subcell "7" does not have a subcell, therefore the physical data contained within subcell "7" will be processed in operation 318.

Once the method processes subcell "7" in operation 318, the method will proceed to operation 320 and determine if there is a previous cell. Referring to the original example, the method will move to subcell "e" in operation 322 because that is the previous subcell to subcell "7," as shown in FIG. 2. After the method goes to subcell "e" it will determine if there is a non-processed subcell in operation 324. In this case, subcell "6" has already been processed when the subcells of subcell "d" were processed. Accordingly, the processing of subcell "6" will be skipped. For example, when the operation 318 processes the physical data of a feature (e.g., via, contact, metallization line, etc.) in a subcell, it globally processes all other instances of the same subcells in the entire database. As a result, when the method encounters the same subcell in another location, it will view that subcell as a previously processed subcell and will skip that subcell. In our example, the subcell "6" of subcell "e" was processed when the subcell "6" of subcell "d" was processed. If the method encounters subcell "6" again in another part of the database, it will not move to that subcell because the subcell was already processed.

Because subcell "6" of subcell "e" was already processed, the method will move back to operation 318 where the physical data of subcell "e" is processed. In operation 320, it is determined that there is a previous subcell and the method moves to subcell "1" in operation 322. Now, it is determined in operation 324 whether there is a non-processed subcell of "1." Since all subcells under subcell "1" have been processed, the method moves again to operation 318 where the physical data of subcell "1" is processed.

After subcell "1" is processed, the method moves to operation 320 where it is determined that there is a previous subcell "b" and the method moves to subcell "b" in operation 322. In operation 324 it is determined whether there is a non-processed subcell. In the example of FIG. 2, there are non-processed subcells. Accordingly, the method will move to subcell "2" in operation 326 and then determine if there is a subcell in 328. Since there is a subcell, the method will move to subcell "f" in operation 326. The method will move to subcell "8" by processing through operations 326 and 328. The method will then determine that subcell "8" does not have another subcell in operation 328. As such, the method will move to operation 318 and process the physical data in the subcell "8." Afterwards, the method will go to subcell "f" again in operations 320 and 322 and find that there are no more non-processed subcells in operation 324. Because subcell "6" was previously processed, the method will not move to this subcell "6" and perform any processing. The method will therefore move from operation 324 to operation 318 where the physical data of subcell "f" is processed. Next, the method will move to subcell "2" when it is determined that there is a non-processed subcell "new." Once the method gets to the subcell "new," it will perform operation 328 and find that the subcell "new" contains no other subcells, as shown in FIG. 2. The method will then process the physical data in the subcell "new" in operation 318 and eventually move to operation 320. As will be discussed below, the subcell "new" is provided in this example to illustrate a subcell that already conforms to the uniform micron technology. Therefore, when it is processed in operation 318, no changes will be made.

In operation 320, the method will find the subcell "2" and move to subcell "2" in operation 322. As shown in FIG. 2, the subcell "2" does not contain any more non-processed subcells, consequently, the method will move to operation 318 where subcell "2" is processed. Once processed, the method will move to subcell "b" in operation 322 and determine that all subcells have been processed. Thus, the method will move to operation 318 where subcell "b" is processed. After this processing, the method will move to subcell "a" which is the top subcell. The method described with reference to the branch off of subcell "b" will therefore continue off of the subcell "c" in the same manner. Of course, whenever a previously processed subcell is encountered, that subcell will be skipped. Also, if there are any new subcells which already conform to some user specified micron technology (which will be the uniform micron technology for the design), that new subcell will not be changed.

Figure 4:
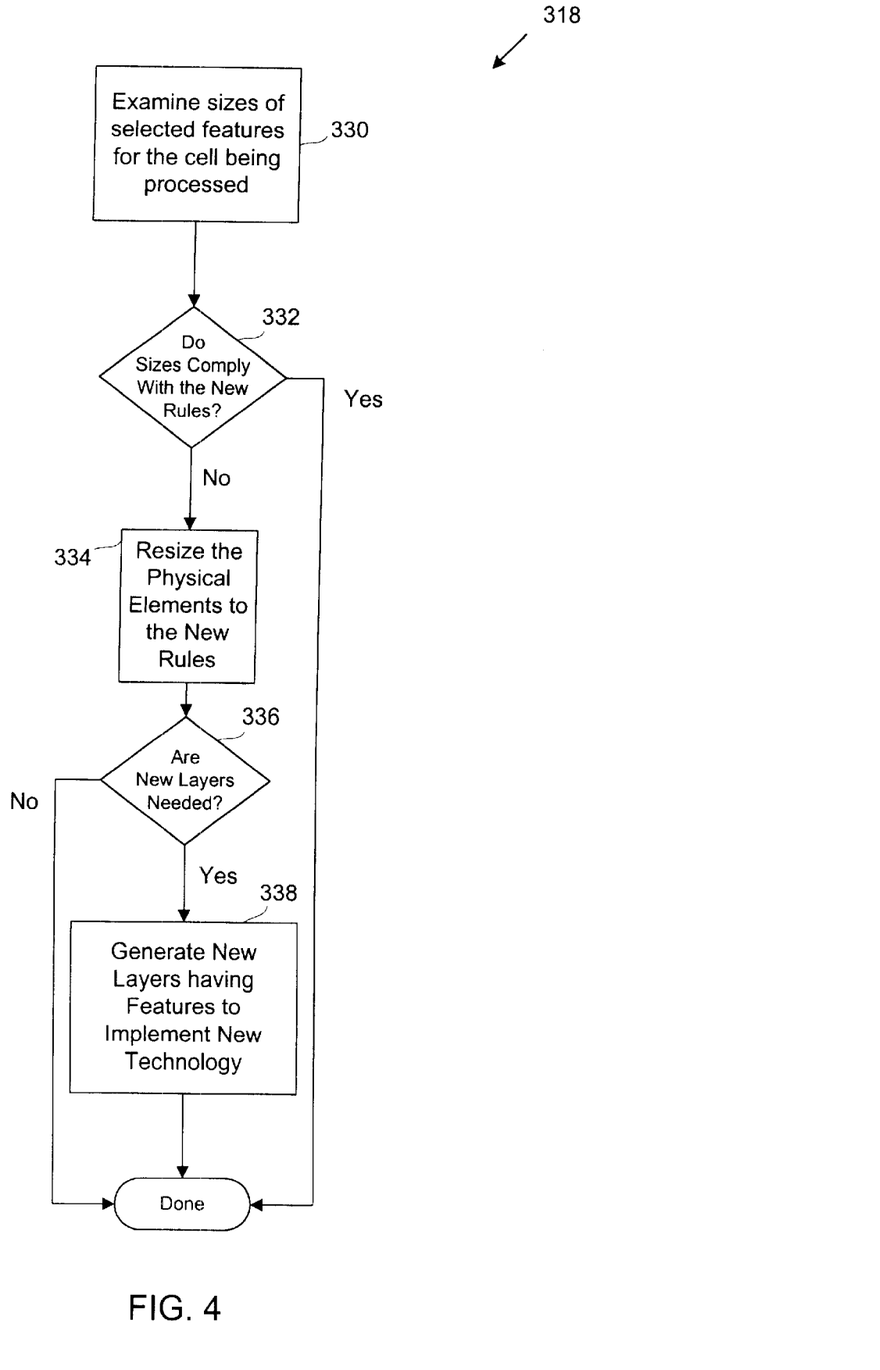
FIG. 4 is a flowchart showing the operation of processing physical data by converting selected physical features of the integrated circuit design to a uniform micron technology in accordance with one embodiment of the present invention.

FIG. 4 is a flowchart defining in more detail the sub-operations performed as part of operation 318, in accordance with one embodiment of the present invention. The operation 318 processes the physical data of the features contained within a subcell that were previously selected by a user in operation 304 of the method 300. For example, a user may select to have vias and contacts checked in each subcell to make sure they comply with a 0.15 micron technology. This would then become the uniform micron technology. The operation 318 first examines the sizes of the physical data of the user selected features of subcells in operation 330. For purposes of example, reference will be made to the subcell "6" in FIG. 2, which is designed according to a 0.25 micron technology. Additionally, for purposes of example only, an assumption will be made that a user has selected modification of vias and contacts and a uniform micron technology of 0.15 in operation 304 of FIG. 3A. During the operation 330, the method will examine the contact and vias in the subcell "6."

After the physical data of the subcell "6" are examined, the method ascertains whether or not the sizes of the physical elements comply with the new rules in operation 332. The operation 332 checks for compliance by comparing the micron technology used for the selected features with the user selected uniform micron technology. If the sizes of the selected features do comply with the uniform micron technology and the associated design rules, the operation 318 will be complete as shown in FIG. 4 and the method will resume with operation 320 in FIG. 3B.

However, if the sizes of the selected features do not comply with the uniform micron technology and the associated design rules, the method will proceed to operation 334. Referring back to our example, an assumption will be made that the features in the subcell "6" were made in accordance with 0.25 micron technology. This does not comply with the 0.15 micron technology and the associated design rules selected by the user. Therefore, the method will proceed to operation 334.

The resizing operation 334 resizes the selected features in a subcell such that the features will conform to the uniform micron technology. In our example, all the vias and contacts in the subcell "6" were designed according to 0.25 micron technology, hence the operation 334 will resize the vias and contacts such that the vias and contacts conform to the uniform 0.15 micron technology. As an overview of the example provided by way of FIGS. 1 and 2, if the selected uniform micron technology is set for 0.15 microns, then all subcells that are not "new" subcells must be processed. However, once a subcell is processed, all instances of the same subcell will be processed. For example, once subcell "6" is processed, all other subcells "6" will be viewed as processed and thus skipped for processing. This saves substantial time in that repetitive processing of subcells is avoided.

After the resizing operation 334 is complete, the method will determine whether or not new layers are needed in operation 336. A new technology may require that certain layers derived in earlier technologies be explicitly drawn. For example, an NLDD mask may have been derived from the intersection of N plus and P well in one technology, while a new technology demands that the NLDD layer be drawn. A combination of logical and sizing operations can create the NLDD layer in the layout database. If the operation 336 determines that a new layer is not needed, the operation 318 will be complete as shown in FIG. 4 and the method will resume with operation 320 in FIG. 3B.

On the other hand, if the operation 336 determines that new layers are needed, new layers will be generated in operation 338. Once the operation 338 is complete for a particular subcell being processed, the method 318 will be done as shown in FIG. 4.

As discussed above, the present invention allows users to check and convert an integrated circuit design in a more efficient manner. The method globally changes subcells within an integrated design circuit. When the features of one subcell are modified, the same feature will be modified throughout the entire integrated circuit design. This greatly reduces the time designers spend in modifying features since the same feature may appear thousands of times in an integrated circuit design. Now, some integrated circuit designs in their entirety may be modified and checked in a matter of minutes as opposed to days, which is the time required by conventional repetitive methods.

The present invention also allows a DRC (design rule checker) to check an integrated design circuit after its features have been modified. In the past, a DRC checker could not be used once a conversion was done, thus any new imperfection could not be found. Now, after features using a micron technology different from the one specified by the user have been converted, the method can implement a DRC checker to ensure that no new imperfections have been created. This allows a user to know with higher certainty that the modified integrated circuit design contains no imperfections.

In addition, the new method avoids the problems of the past where designers often would wait until a reticle was fabricated before ascertaining what errors were present in an integrated circuit design. Designers were forced to do this because they lacked the time and the resources to manually check the thousands upon thousands of features in a circuit design. Now, designers may check an integrated circuit design in a short period of time and have a high degree of confidence that the reticle produced will not contain errors originating from the modifications to the integrated circuit design. Therefore, this avoids the potential for wasted time and money in that a designer will be more certain that a reticle will come out as planned.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include read-only memory, random-access memory, hard drives, RAID arrays, CD-ROMs, CD-Rs, CD-RWs, magnetic tapes, and other optical data storage devices. The computer readable medium can also be distributed over a network coupled computer system so that the computer readable code is stored and executed in a distributed fashion.

Appendix A is exemplary source code for a method in accordance with one embodiment of the present invention. The source code of this example was generated using a Cadence SKILL programming language. It should be appreciated that the following source code is only one embodiment of the disclosed invention. Furthermore, the present invention may be practiced with source code that achieves the same function but is either pro-rammed in a different language or uses different or additional functions to achieve the embodiments of the claimed invention.

APPENDIX

```
***************************************************************
Function Name:   v10tov11 [e.g., going from a v10 micron technology to a v11 micron technology]
Title of Run:    Resize contacts and vias, and generate any needed layers
Synopsis:        v10tov11() => nil
Description:     Converts vsc10 to vsc11 database by generating n/p1dd, vtn/p and hci layers, then
                 resizing contacts and vias. The file is overwritten.
***************************************************************
```

APPENDIX-continued

```
procedure ( v10tov11 ()
;Convert layout from VSC10 to VSC11
;Resize contacts and vias, then generate 1dd and high-Vt layers
    mainWin = hiGetCurrentWindow()
    mainCell = geGetWindowCellView()
;
    startTime=getCurrentTime ()
    checkedCells=()
    levels=0
    v10v11A11 ()
    stopTime=getCurrentTime()
    printf("Execution time %d \n" compareTime(stopTime startTime) )
)
;Multi-level recursive conversion
;Descend into any subcells
;Repeat until no more descents possible
;Resize contacts and vias, return
procedure ( v10v11A11 ()
  let( (blockName editCell)
;Resize contacts and vias within each instance cell
;********************************************
;
    ; Go through list of instances and arrays.
    editCell = geGetWindowCellView(mainWin)
    foreach (header editCell~>instHeaders
      ; if instance has not been previously checked, descend into
cell
        inst = car(header~>instances)
        blockName = inst~>cellName
          if( not(member(blockName checkedCells))
            then
              checkedCells = cons( blockName checkedCells )
          descend into cell
              if( gePush( mainWin "a" inst 0 1 1 ni1) then
                levels=levels+1
printf("%d levels of hierarchy \n" levels)
              v10v11A11 ()
              geReturn ()
              levels=levels-1
            );if push succeeds
          else
);if not checked
      ); for loop
printf(" Converting cell %s \n" editCell~>cellName)
    resize ()
    1ddVtGen ()
    geSave ()
  )
)
procedure (resize ()
  prog( (sizeCont sizeVia sizeVia4)
;Contact and via resizing (per side) are specific to the technology
;The example is for converting from VSC10 to VSC11
    sizeCont = −0.04     {
    sizeVia = −0.03      {    Offset per side
    sizeVia4 = −0.06     {
    finContSize=0.24     {
    finViaSize=0.26      {    New
    finVia4Size=0.4      {
    curCell = geGetWindowCellView(mainWin)
    contShapes = leSearchHierarchy( curCell curCell~>bBox 0
        "any shape" list( list( "layer" "==" list( "cont" "drawing" )
) ) )
;Check first contact - if v10 size, resize all contacts
    if( length(contShapes) > 0 then
      shape=car (contShapes)
      delx=xCoord(upperRight(shape~>bBox) )-
xCoord( lowerLeft (shape~>bBox))
      if( delx>finContSize+0.01 then
        foreach(shape contShapes leSizeShape(shape sizeCont) )
      )
    )
    via1Shapes = leSearchHierarchy( curCell curCell~>bBox 0
        "any shape" list( list( "layer" "==" list( "via" "drawing" )
) ) )
    via2Shapes = leSearchHierarchy( curCell curCell~>bBox 0
        "any shape" list( list( "layer" "==" list( "via2" "drawing" )
) ) )
    via3Shapes = leSearchHierarchy( curCell curCell~>bBox 0
        "any shape" list( list( "layer" "==" list( "via3" "drawing" )
```

APPENDIX-continued

```
) ) )
    viaShapes=nconc(via1Shapes via2Shapes via3Shapes)
    if( length(viaShapes) > 0 then
      shape=car (viaShapes)
      delx=xCoord(upperRight (shape~>bBox) )-
xCoord(lowerLeft (shape~>bBox))
      if( delx>finViaSize+0.01 then
        foreach(shape viaShapes leSizeShape(shape sizeVia) )
      )
    )
    via4Shapes = leSearchHierarchy( curCell curCell~>bBox 0
      "any shape" list( list( "layer" "==" list( "via4" "drawing" )
) ) )
    if( length(via4Shapes) > 0 then
      shape=car (via4Shapes)
      delx=xCoord(upperRight (shape~>bBox) )-
xCoord( lowerLeft (shape~>bBox))
      if( delx>finVia4Size+0.01 then
        foreach(shape via4Shapes leSizeShape(shape sizeVia4) )
      )
    )
)
procedure (1ddVtGen ()
; generate LDD and high-Vt implants from a layout with well and N/P+
    1ddSize = 0.2
;   sdSize = 0.3
    curCell = geGetWindowCellView()
    cellBox = curCell~>bBox
;Generate LDD layers if there are no drawn LDD geometries
    n1ddShapes = leSearchHierarchy( curCell cellBox 0
      "any shape" list( list( "layer" "==" list( "n1dd" "drawing" ) ) )
)
    p1ddShapes = leSearchHierarchy( curCell cellBox 0
      "any shape" list( list( "layer" "==" list( "p1dd" "drawing" ) ) )
)
    if( length(n1ddShapes)==0 && length(p1ddShapes)==0 then
      n1dds = leLayerAndNot( curCell list("nplus" "drawing")
list ("nwell" "drawing")
      list("n1dd" "drawing") )
;remove slivers
      foreach (shape n1dds
        shpList=leSizeShape(shape -1ddSize)
        foreach(sh1 shpList leSizeShape(sh1 1ddSize) )
        ); foreach
      p1dds = leLayerAndNot( curCell list("pplus" "drawing")
list ("pwell" "drawing")
      list("p1dd" "drawing")
      foreach (shape p1dds
        shpList=leSizeShape (shape -1ddSize)
        foreach(sh1 shpList leSizeShape(sh1 1ddSize) )
        ); foreach
      hcis = leLayerAnd( curCell list("pwell" "drawing") list("tgox"
"drawing")
      list("hci" "drawing") )
    );if no 1ddShapes
    vtnShapes = leSearchHierarchy( curCell cellBox 0
      "any shape" list( list( "layer" "==" list( "vtn" "drawing" ) ) ) )
    vtpShapes = leSearchHierarchy( curCell cellBox 0
      "any shape" list( list( "layer" "==" list( "vtp" "drawing" ) ) ) )
    if( length(vtnShapes) == 0 && length(vtpShapes)==0 then
;     vtns = leLayerAnd( curCell list("pwell" "drawing")
list ( "prBoundary" "drawing")
;       list ( "vtn" "drawing")
;     vtps = leLayerAnd( curCell list("nwell" "drawing")
list ( "prBoundary" "drawing")
;       list("vtp" "drawing") )
      vtns = leLayerAndNot( curCell list("pwell" "drawing") list("tgox"
"drawing")
        list("vtn" "drawing")
      vtps = leLayerAndNot( curCell list("nwell" "drawing") list("tgox"
"drawing")
        list("vtp" "drawing")
    );if no vtShapes
)
********************************************************************************
```

Although the foregoing invention has been described in some detail for purposes of clarity of understanding, it will be apparent that certain changes and modifications may be practiced within the scope of the appended claims.

Accordingly, the present embodiments are to be considered as illustrative and not restrictive, and the invention is not to be limited to the details given herein, but may be modified within the scope and equivalents of the appended claims.

What is claimed is:

1. A method for converting physical features of an integrated circuit design to a uniform micron technology, the integrated circuit design being defined by a plurality of cells, each cell being defined by one or more micron technologies, and a user is prompted to provide key design rules that define desired features associated with one or more micron technologies, the method comprising:

(a) examining layout database for the integrated circuit design, the layout database having a hierarchical structure;
    (b) identifying a top cell from the layout data base of the integrated circuit design;
    (c) descending through a first branch of the hierarchical structure of the layout database to a lowest cell in the first branch;
    (d) determining whether physical data of the user desired features have been previously processed for the lowest cell;
    (e) determining whether the physical data of the user desired features for the lowest cell complies with the uniform micron technology;
    (f) processing the physical data of the user desired features if the lowest cell has not been previously processed and does not comply with the uniform micron technology; and
    (g) moving to other lowest cells in the first branch and repeating (d)–(f), wherein the lowest cell is now the other lowest cells.

2. A method for converting physical features of an integrated circuit design to a uniform micron technology as recited in claim 1, further comprising:

(g) moving to a previous subcell having all processed subcells and repeating (d)–(f), wherein the lowest subcell is now the previous subcell.

3. A method for converting physical features of an integrated circuit design to a uniform micron technology as recited in claim 2, further comprising:

(h) descending through a next branch of the hierarchical structure of the layout database to a lowest cell in the next branch and repeating (d)–(g), wherein the first branch is the next branch.

4. A method for converting physical features of an integrated circuit design to a uniform micron technology as recited in claim 3, further comprising:

(i) performing a design rule check after the conversions of the physical features of the integrated design circuit have been completed to determine compliance with the key design rules of the uniform micron technology.

5. A method for converting physical features of an integrated circuit design to a uniform micron technology as recited in claim 1, wherein the operation of processing the physical data includes:

resizing the physical data of the user desired features of the lowest cell to comply with the uniform micron technology.

6. A method for converting physical features of an integrated circuit design to a uniform micron technology as recited in claim 5, wherein the operation of resizing the physical data includes:

determining if a new layer is necessary; and
    generating the new layer if necessary, the new layer having features to implement the uniform micron technology of the lowest cell.

7. A method for the efficient conversion of features in an integrated circuit design, wherein a user selects the features to be converted in the integrated circuit design, and a uniform micron technology for the features, the method comprising:

(a) providing the integrated circuit design wherein the integrated circuit design is defined by a hierarchical layout database of multiple cells;
    (b) identifying a top cell of the hierarchical layout database;
    (c) identifying subcells nested from the top cell;
    (d) descending to a lowest subcell of the subcells;
    (e) determining if physical data of the features selected by the user in the lowest subcell have been previously processed;
    (f) determining if the physical data of the features selected by the user in the lowest subcell conforms to the uniform micron technology selected by the user if it is determined that the physical data has not been previously processed;
    (g) processing the physical data of the features selected by the user in the lowest subcell to conform to the uniform micron technology if it is determined that the physical data as -not been previously processed and does not conform to the uniform micron technology;
    (h) moving to a next lowest subcell of the subcells nested from the top cell; and
    (i) repeating operations (e) through (g), wherein the lowest subcell is now the next lowest subcell.

8. A method for the efficient conversion of features in an integrated circuit design according to claim 7, wherein the operation of identifying subcells nested from the top cell further comprises:

(h) moving to a next lowest subcell of the subcells nested from the top cell;
    (i) repeating operations (e) through (g), wherein the lowest subcell is now the next lowest subcell; and
    (j) repeating operations (h) and (i) for any remaining lowest subcells nested from the top cell.

9. A method for the efficient conversion of features in an integrated circuit design according to claim 8, further comprising:

(k) performing a design rule check after the conversions of the physical features of the integrated design circuit have been completed to determine compliance with the uniform micron technology.

10. A method for the efficient conversion of features in an integrated circuit design according to claim 9, further comprising:

(l) determining if a new layer is necessary; and
    (m) generating the new layer if necessary, the new layer having features to implement the uniform micron technology of the lowest cell.

11. A method for the efficient conversion of features in an integrated circuit design according to claim 7, further comprising:

(h) moving, to a previous subcell having all processed subcells and repeating (e)–(g), wherein the lowest subcell is now the previous subcell.

12. A method for the efficient conversion of features in an integrated circuit design according to claim 7, wherein the operation of determining if the physical data of the features selected by the user in the lowest subcell conforms to the uniform micron technology selected by the user includes:

comparing the physical data of the lowest subcell with the uniform micron technology selected by the user.

13. A method for the efficient conversion of features in an integrated circuit design according to claim 8, wherein the operation of processing the physical data of the features selected by the user in the lowest subcell to conform to the uniform micron technology includes:

resizing the physical data of the lowest subcell to conform to the uniform micron technology selected by the user.

14. A layout tool for converting the physical features of an integrated circuit design, wherein the integrated circuit design is defined by a plurality of cells arranged in a hierarchical layout database, each cell being defined by one or more micron technologies, and a user selects the features to be convened in the integrated circuit design and a uniform micron technology for the features, the tool comprising:

program instructions for identifying a top cell in the hierarchical layout database;

program instructions for identifying a subcell nested form the top cell;

program inscriptions for descending from a branch the subcell to a lowest cell;

program instructions for processing physical data the features selected by the user in the lowest subcell to conform to the uniform micron technology, wherein the physical data of the features is processed if the lowest subcell has not been previously processed;

program instructions for moving to other lowest subcells and repeating the program instructions for processing physical data of the features, wherein the lowest subcell is now the other lowest subcells; and program instructions for design rule checking the hierarchical layout database after all the physical data from the features selected by the user have been processed.

15. A computer readable media having program instructions for carrying out a method for the efficient conversion of features in an integrated circuit design, wherein a user selects the features to be converted in the integrated circuit design and a uniform micron technology for the features, the computer readable media comprising:

(a) programming instructions for providing the integrated circuit design wherein the integrated circuit design is defined by a hierarchical layout database of multiple cells;

(b) programming instructions for identifying a top cell from the hierarchical layout database;

(c) programming instructions for identify subcells nested from the top cell;

(d) programming instructions for descending to a lowest subcell of the top cell;

(e) programming instructions for processing physical data of the features selected by the user to conform the physical features to the uniform micron technology and;

(f) programming instructions for determining if the physical data for the user defied features of the lowest subcell has been previously processed; and (g) programming instructions for moving to other lowest subcells and repeating (e)–(f) wherein the lowest subcell is now the other lowest subcells.

16. A computer readable media having program instructions for carrying out a method for the efficient conversion of features in an integrated circuit design as recited in claim 15, further comprising:

(f) programming instructions for performing a design check on the hierarchical layout database after the processing of the physical data of the features selected by the user is complete.

17. A computer readable media having program instructions for carrying out a method for the efficient conversion of features in an integrated circuit design as recited in claim 16, further comprising:

(g) programming instructions for determining whether the physical data of the features selected by the user conform with the uniform micron technology.

18. A computer readable media having program instructions for carrying out a method for the efficient conversion of features in an integrated circuit design as recited in claim 16, wherein the instruction for resizing the physical data of the user selected feature further includes:

programming instructions for determining if new layers are necessary to implement the uniform micron technology; and programming instruction for generating new layers if it is necessary to implement the uniform micron technology.

* * * * *